United States Patent
Lee

(10) Patent No.: US 7,679,192 B2
(45) Date of Patent: Mar. 16, 2010

(54) SEMICONDUCTOR DEVICE INCLUDING COVER LAYER

(75) Inventor: Han-Choon Lee, Seoul (KR)

(73) Assignee: Dongbu HiTek Co., Ltd., Seoul (KR)

(*) Notice: Subject to any disclaimer, the term of this patent is extended or adjusted under 35 U.S.C. 154(b) by 4 days.

(21) Appl. No.: 11/617,073

(22) Filed: Dec. 28, 2006

(65) Prior Publication Data

US 2007/0152334 A1 Jul. 5, 2007

(30) Foreign Application Priority Data

Dec. 29, 2005 (KR) .................. 10-2005-0134356

(51) Int. Cl.
*H01L 23/52* (2006.01)
*H01L 21/4763* (2006.01)

(52) U.S. Cl. .................. 257/751; 257/E23.145; 257/774; 257/757; 257/734; 257/754; 257/E21.576; 257/750; 257/758; 257/653; 257/369; 257/E23.019

(58) Field of Classification Search .......... 257/751, 257/774, E23.145, 757, 734, 754, E21.576, 257/750, 758, 767, 762, 743, 753, 369, E23.019; 438/627, 629

See application file for complete search history.

(56) References Cited

U.S. PATENT DOCUMENTS

| | | | | |
|---|---|---|---|---|
| 6,878,620 B2 * | 4/2005 | Nguyen et al. | ............... | 438/633 |
| 7,087,515 B2 * | 8/2006 | Ahn et al. | ................... | 438/618 |
| 7,199,044 B2 * | 4/2007 | Ohtsuka et al. | ............. | 438/627 |
| 7,253,097 B2 * | 8/2007 | Lim et al. | .................... | 438/627 |
| 7,253,524 B2 * | 8/2007 | Wu et al. | .................... | 257/762 |
| 7,309,658 B2 * | 12/2007 | Lazovsky et al. | ........... | 438/754 |
| 7,466,027 B2 * | 12/2008 | Ko et al. | ..................... | 257/774 |
| 2004/0067658 A1 * | 4/2004 | Ko et al. | ..................... | 438/778 |
| 2004/0150075 A1 * | 8/2004 | Kaji | ......................... | 257/632 |
| 2005/0110153 A1 * | 5/2005 | Wu et al. | .................... | 257/762 |
| 2006/0003577 A1 * | 1/2006 | Sone | ........................... | 438/638 |

* cited by examiner

*Primary Examiner*—Alexander O Williams
(74) *Attorney, Agent, or Firm*—Sherr & Vaughn, PLLC

(57) ABSTRACT

A semiconductor device includes a semiconductor substrate, an interlayer insulating film formed over the substrate, a trench formed in the interlayer insulating film, a cover film formed over the inside surface of the trench, a barrier layer formed over the cover film; and a metal line formed over the barrier layer which fills and seals the trench. The metal line is in direct contact with the semiconductor substrate.

11 Claims, 4 Drawing Sheets

SEMICONDUCTOR DEVICE INCLUDING COVER LAYER

The present application claims priority under 35 U.S.C. 119 and 35 U.S.C. 365 to Korean Patent Application No. 10-2005-0134356 (filed on Dec. 29, 2005), which is hereby incorporated by reference in its entirety.

BACKGROUND

As semiconductors achieve higher levels of integration and ever faster switching speeds, metal wiring layers formed within the semiconductor devices are getting finer and using multiple layers. However, as the widths of the metal wiring layers are reduced, signal delays may occur due to a resistance and parasitic capacitance (RC) of the metal wirings, thus impeding high speed switching and processing in semiconductor devices. An increase in leakage currents may also occur, increasing power consumption.

To reduce such signal delays, copper wiring may be employed instead of aluminum wiring. However, with the trend towards narrower wiring, parasitic capacitance between wiring increases, so that signal delays may occur even using copper wiring. To reduce the problem of RC delays, a low-k interlayer insulating film may be used between the wirings. As semiconductor devices get finer, a lower dielectric constant may improve performance significantly.

An interlayer insulating film may be formed with a porous low-k material. However, this alternative creates another difficulty: the pores on the surface of the interlayer insulating film degrade the flatness of the surface, making it difficult to properly deposit a film over the interlayer insulating film. In particular, the porous interlayer insulating film degrades the integrity of the diffusion barrier layer, which allows a greater diffusion of copper through the barrier.

SUMMARY

Embodiments relate to a semiconductor device having a copper wiring layer. Embodiments relate to a method for manufacturing a semiconductor device having a copper wiring layer.

Embodiments relate to a porous interlayer insulating film capable of preventing a diffusion of copper or other materials into another layer. Further, the porous interlayer insulating film is also capable of preventing the pores from becoming filled with foreign materials, which may degrade subsequent processes, thereby degrading the electrical properties of the resulting semiconductor device.

Embodiments relate to a semiconductor device including: a semiconductor substrate; an interlayer insulating film formed over the substrate and provided with a trench; a cover film formed over the inside surfaces of the trench; a barrier layer formed over the cover film; and a metal line formed over the barrier layer and filling the trench, wherein the metal line is in direct contact with the semiconductor substrate.

Embodiments relate to a method for forming a semiconductor device, including: forming an interlayer insulating film over a semiconductor substrate; forming a trench over the interlayer insulating film through a selective etching process, the trench exposing a portion of the semiconductor substrate; depositing a cover film inside the trench, the cover film being formed of SiN; removing portions of the barrier layer and the cover film deposited over a bottom of the trench, to thereby expose the semiconductor substrate; and forming a metal line over the barrier layer.

BRIEF DESCRIPTION OF THE DRAWINGS

Example

Figure 2:
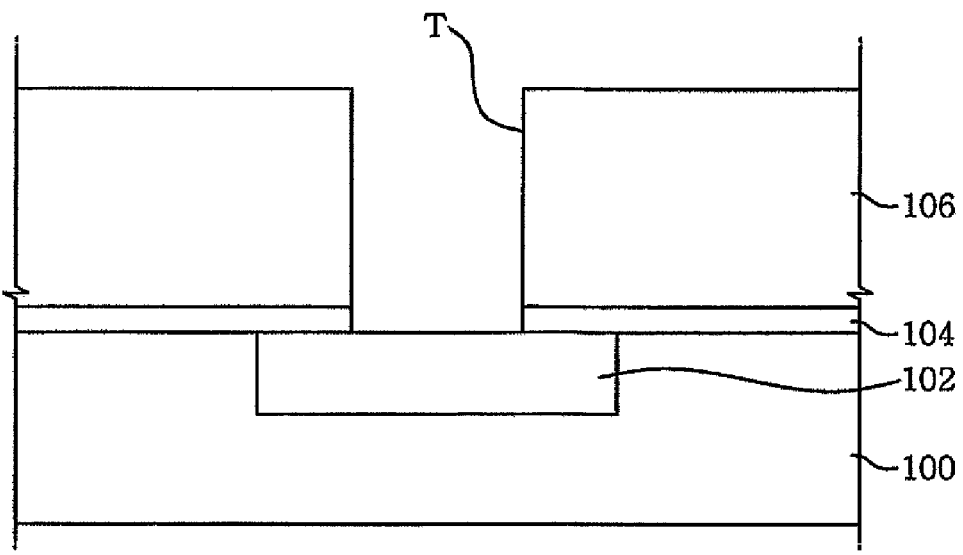
Figure 3:
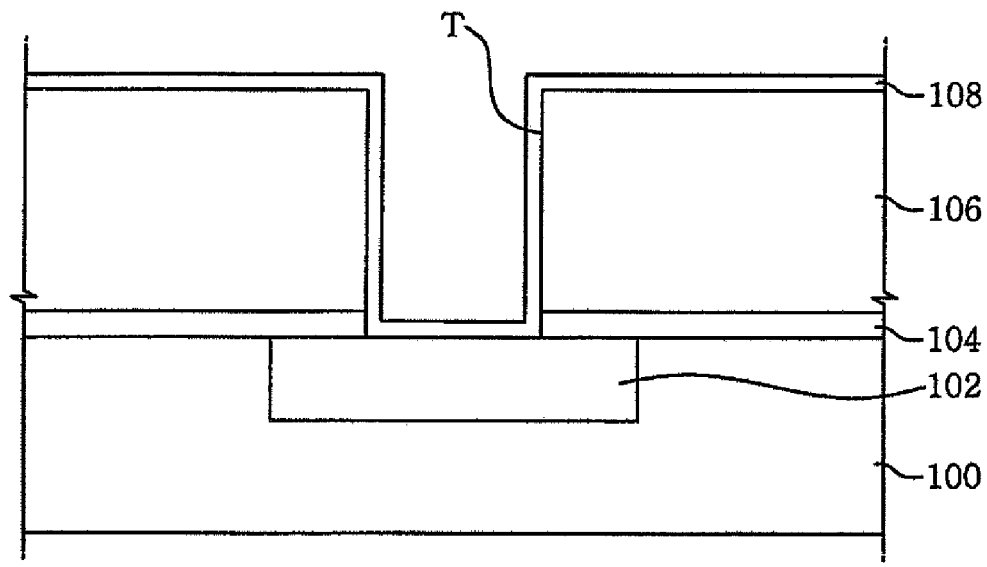
Figure 4:
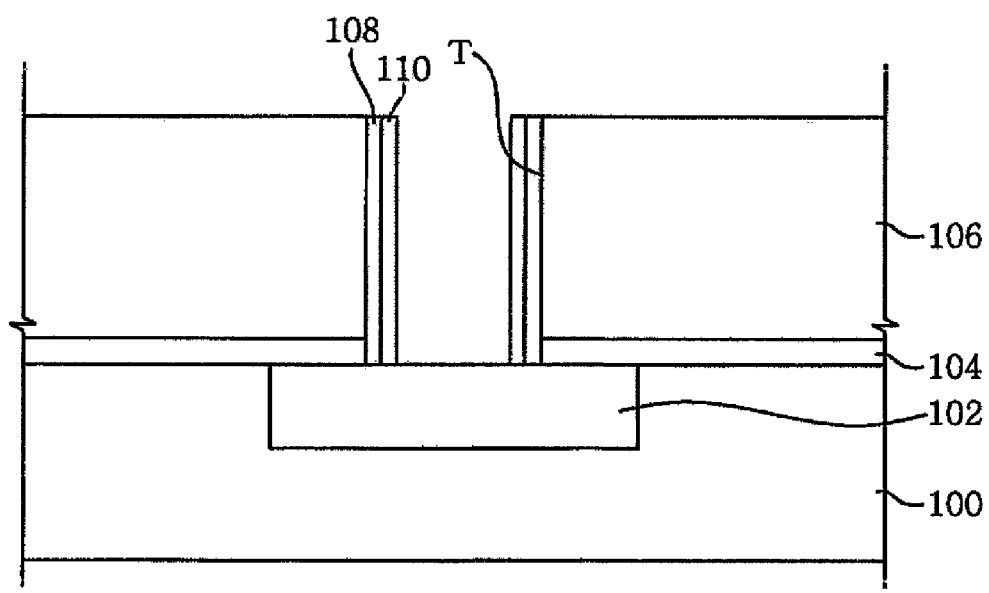
Figure 5:
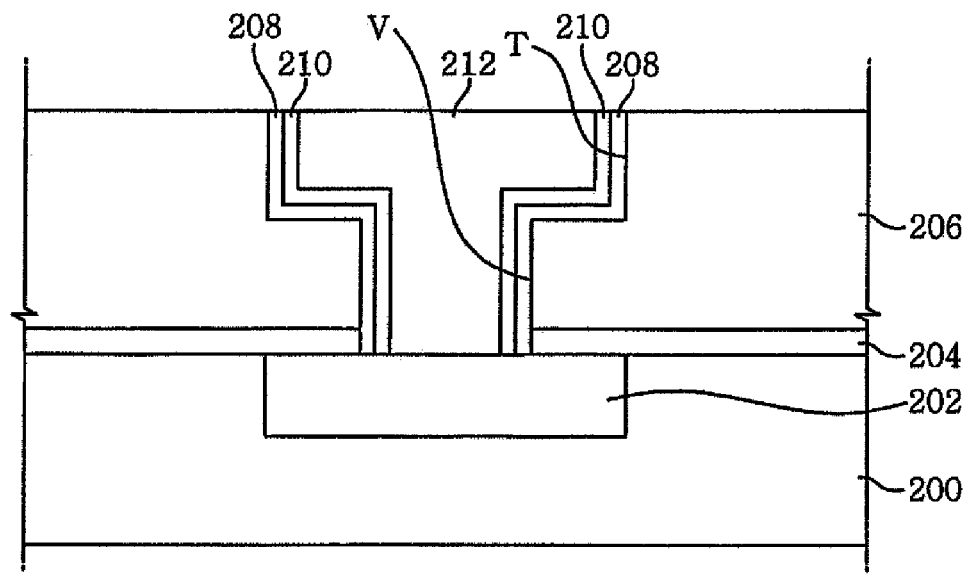
Figure 6:
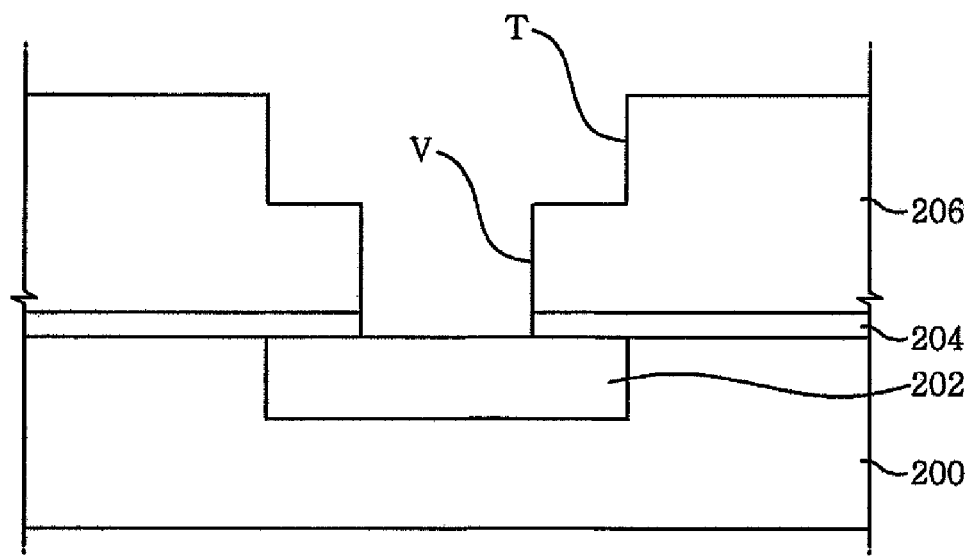
Figure 7:
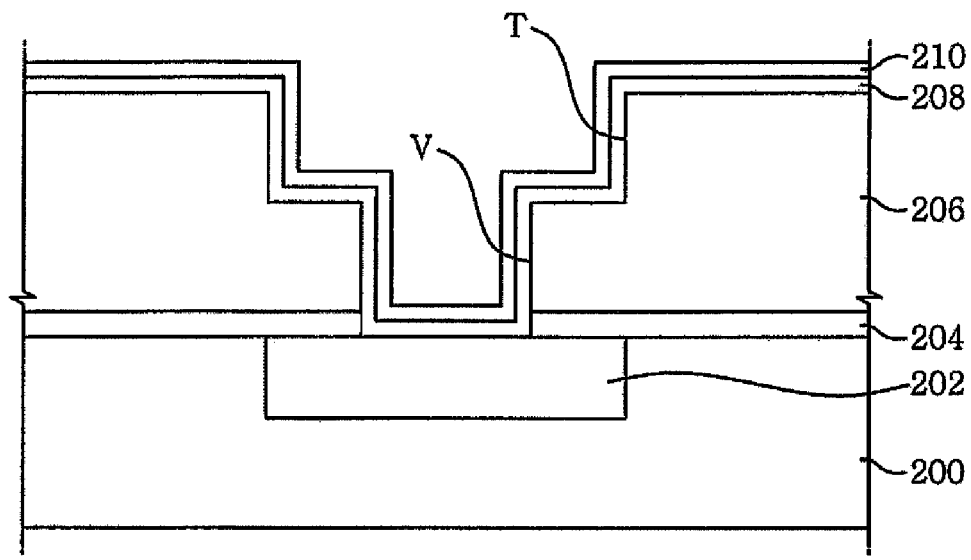
Figure 8:
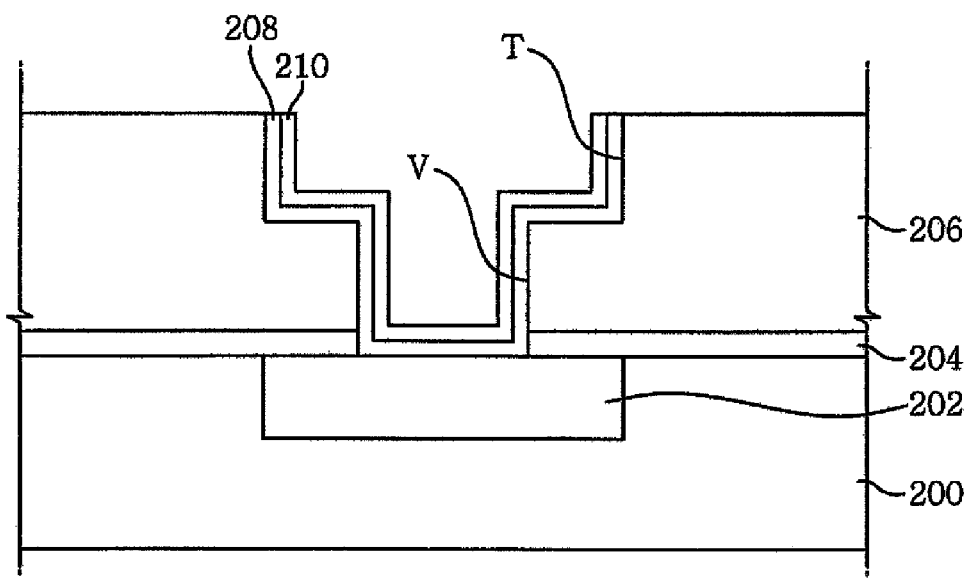

Example FIGS. 2 to 4 provide cross sectional views describing a method for forming the metal line of the semiconductor device in accordance with embodiments;

Example FIG. 5 is a cross sectional view showing a metal line of a semiconductor device in accordance with embodiments;

Example FIGS. 6 to 8 present cross sectional views describing a method for forming the metal line of the semiconductor device in accordance with embodiments.

DETAILED DESCRIPTION

Figure 1:
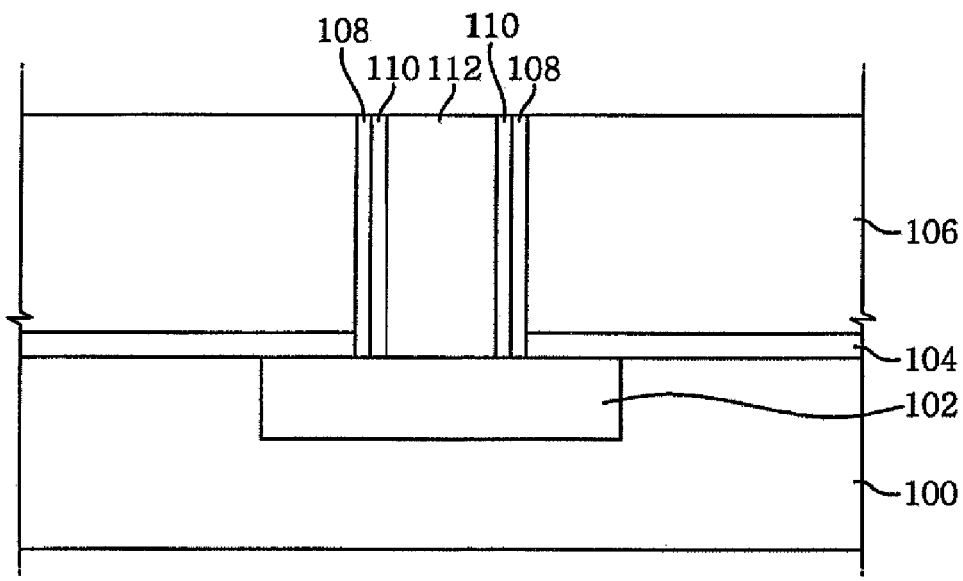
FIG. 1 is a cross sectional view showing a metal line of a semiconductor device in accordance with embodiments.

Referring to example FIG. 1, there is provided a cross sectional view showing a metal line of a semiconductor device in accordance embodiments.

As shown in example FIG. 1, an etch stop layer 104 and an interlayer insulating film 106 are formed over a substrate 100. The substrate 100 may include individual devices (not shown) or a lower conductor 102.

The lower conductor 102 may be formed of copper (Cu), aluminum (Al), tungsten (W), silver (Ag), gold (Au), platinum (Pt), or the like. The etch stop layer 104 may be made of SiN, $SiH_4$, or the like. The interlayer insulating film 106 may be formed by depositing an organic or inorganic insulating material such as a fluorine silicate glass (FSG), an undoped silicate glass (USG), $SiH_4$, a tetra ethylortho silicate (TEOS), in either a single layer or multiple sub-layers. Alternatively, the interlayer insulating film 106 may be formed of a low-k material such as a black diamond (BD) having a dielectric constant not greater than a value of about 3.0. The interlayer insulating film 106 may be configured to have pores to further reduce its dielectric constant.

Trench T (see example FIG. 2) extends through the etch stop layer 104 and the interlayer insulating film 106 to expose the lower conductor 102 of the substrate 100.

Referring again to example FIG. 1, a cover film 108 may be formed over the inside surface of the trench T. As shown in FIG. 4, a barrier layer 110 is formed over the cover film 108. The cover film 108 may be formed of SiN, and the barrier layer 110 may be formed of TaN, Ta, WN, Ti, TiN, TiSiN, TaSiN, or the like. The barrier layer 110 may be formed in multiple layers with combinations of these or equivalent materials.

Among other effects, the barrier layer 110 prevents material in a metal layer from being diffused into another layer. The barrier layer may also enhance the adhesion between the insulating film and the metal layer.

A metal line 112 is formed so as to fill the trench defined by the barrier layer 110, wherein the metal line 112 is electrically connected with the lower conductor. The metal line 112 is formed of a conductive, low resistance material such as copper.

Below, a method for forming the metal line of the semiconductor device having the above configuration will be explained with reference to example FIGS. 2 to 4 together with FIG. 1.

Example FIGS. 2 to 4 provide cross sectional views to describe the manufacturing method of the metal line of the semiconductor device in accordance with embodiments.

As shown in FIG. 2, the etch stop layer 104 and the interlayer insulating film 106 are deposited over the substrate 100 having the lower conductor 102.

Then, a trench T is formed at the interlayer insulating film 106 through a selective etching process using a photoresist film (not shown) so that a part of the etch stop layer 104 is exposed through the trench T.

Then, the exposed etch stop layer is removed, so that a portion of the lower conductor 102 is exposed.

Next, as shown in example FIG. 3, the cover film 108 made of SiN may be deposited to cover the inner bottom and the inner side surfaces of the trench T. The cover film 108 may be formed by using a furnace containing therein a gas including nitrogen such as HCD (hexachlorosilane) and BTBAS (bis-tertiary butyl amino silane) and maintained at a temperature of about 580 to 600° C. A relatively thin cover film 108 may be obtained using the furnace, at a temperature which may be lower than that for CVD (chemical vapor deposition).

As shown in example FIG. 4, a metal is deposited over the cover film 108 by sputtering, CVD, PVD (physical vapor deposition), ALD (atomic layer deposition), or the like, thus forming the barrier layer 110.

Thereafter, portions of the barrier layer 110 and the cover film 108 located over the bottom of the trench T are removed. The portion of cover film 108 deposited over the bottom of the trench T is removed because it degrades the electrical connection between the lower conductor and an upper conductor.

In order to remove only the portions of barrier layer 110 and cover film 108 deposited over the bottom of the trench T, an etching process with high degree of directionality may be used. Specifically, the partial removal of the barrier layer 110 and the cover film 108 may be accomplished by injecting an Ar gas of 20 to 80 sccm with a power ranging from about 100 W to about 1000 W, a bias power ranging from about 200 to 800 W, a pressure ranging from about 2000 to 8000 mTorr and a temperature ranging from about −25 to 150° C. Here, by adding the metal plasma used for forming the barrier layer 110 into the above processing conditions, the portion of barrier layer 110 deposited over the inner side surface of the trench T can be replenished. For example, a Ta or Ti plasma may be added.

Referring back to FIG. 1, a copper layer is deposited so as to fill and seal the trench defined by the barrier layer 110. Thereafter, by planarizing the resulting substrate structure, the metal line 112 is formed.

Example FIG. 5 is a cross sectional view showing a metal line in a semiconductor device in accordance with embodiments.

As shown in FIG. 5, an etch stop layer 204 and an interlayer insulating film 206 are formed over a substrate 200.

The substrate 200 may include individual devices (not shown) or a lower conductor 202.

The lower conductor 202 may be formed of copper (Cu), aluminum (Al), tungsten (W), silver (Ag), gold (Au), platinum (Pt), or the like. The etch stop layer 204 may be made of SiN, $SiH_4$, or the like. The interlayer insulating film 206 may be formed by depositing an organic or inorganic insulating material such as a fluorine silicate glass (FSG), an undoped silicate glass (USG), $SiH_4$, a tetra ethylortho silicate (TEOS), in either a single layer or multiple sub-layers. Alternatively, the interlayer insulating film 206 may be formed of a low-k material such as a black diamond (BD) having a dielectric constant not greater than a value of about 3.0. The interlayer insulating film 206 may be configured to have pores to further reduce its dielectric constant.

Formed in the etch stop layer 204 and the interlayer insulating film 206 is a via V through which the lower conductor 202 is exposed. Trench T, which exposes the via V, is also formed in the interlayer insulating film 206.

A cover film 208 is formed to cover the inside surfaces of the via V and the trench T, and a barrier layer 210 is formed over the cover film 208. The cover film 208 may be formed of SiN, and the barrier layer 210 may be formed of TaN, Ta, WN, Ti, TiN, TiSiN, TaSiN, or the like. The barrier layer 210 may be formed in multiple layers with combinations of these or equivalent materials.

Among other effects, the barrier layer 210 prevents material in a metal layer from being diffused into another layer. The barrier layer may also enhance the adhesion between the insulating film and the metal layer.

Further, the metal line 212 is formed so as to seal a trench and a via defined by the barrier layer 210, wherein the metal line 212 is electrically connected with the lower conductor. The metal line 212 is formed of a conductive material such as copper, which has a low resistance.

Below, a method for forming the metal line of the semiconductor device having the above configuration will be explained with reference to example FIGS. 6 to 8 together with example FIG. 5.

Example FIGS. 6 to 8 provide cross sectional views to illustrate the manufacturing method of metal lines in semiconductor devices in accordance with embodiments.

As shown in FIG. 6, the etch stop layer 204 and the interlayer insulating film 206 are deposited over the substrate 200 with lower conductor 202.

A via V for allowing a portion of the etch stop layer 204 to be exposed is formed through the interlayer insulating film 206 by a selective etching process using a photoresist film (not shown). A trench T is formed in the interlayer insulating film 206 through a selective etching process using a photoresist film (not shown) so that the via V is exposed through the trench T. When the interlayer insulating film 206 is formed in multiple layers (or sublayers), one of the multiple layers of the interlayer insulating film 206 may be used as an etch stop layer.

Thereafter, the portion of etch stop layer 204 exposed through the via V may be removed, so that the lower conductor 202 is exposed. Then, the cover film 208, which may be made of SiN, is deposited to cover the inner surfaces of the trench T and the via V as shown in FIG. 7. The cover film 208 may be formed by using a furnace containing therein a gas including nitrogen such as HCD (hexachlorosilane) and BTBAS (bis-tertiary butyl amino silane) and maintained at a temperature of about 580 to 600° C. A relatively thin cover film 208 may be obtained using the furnace, at a temperature which may be lower than that for CVD (chemical vapor deposition).

As shown in example FIG. 8, a metal is deposited over the cover film 208 by sputtering, CVD, PVD (physical vapor deposition), ALD (atomic layer deposition), or the like, thus forming the barrier layer 210.

Thereafter, portions of the barrier layer 210 and the cover film 208 located over the bottom of the via V are removed. The portion of cover film 208 deposited over the bottom of the via V is removed because it degrades the electrical connection between the lower conductor and an upper conductor.

In order to remove only the portions of barrier layer 210 and cover film 208 deposited over the bottom of the via V, an etching process with high degree of directionality may be used. Specifically, the partial removal of the barrier layer 210 and the cover film 208 may be accomplished by injecting an Ar gas of 20 to 80 sccm with a power ranging from about 100 W to about 1000 W, a bias power ranging from about 200 to 800 W, a pressure ranging from about 2000 to 8000 mTorr and a temperature ranging from about −25 to 150° C. Here, by adding the metal plasma used for forming the barrier layer 210 into the above processing conditions, the portion of barrier layer 210 deposited over the inner side surface of the via V and trench T can be replenished. For example, a Ta or Ti plasma may be added.

As shown in FIG. 5, a copper layer is deposited so as to fill and seal the trench and the via defined by the barrier layer 210. Thereafter, by planarizing the resulting substrate structure, the metal line 212 is formed.

In accordance with embodiments as described above, even when the low-k interlayer insulating film is made of a relatively porous material, diffusion of metal through the barrier layer into another layer through pores can be prevented, because a cover film is formed over the interlayer insulating film prior to the deposition of the barrier layer. Therefore, deterioration of the electrical characteristics in semiconductor devices can be prevented.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A semiconductor device comprising:
a semiconductor substrate;
an etch stop layer formed over the semiconductor substrate and contacting the semiconductor substrate;
an interlayer insulating film formed over the semiconductor substrate and contacting the etch stop layer, wherein the interlayer insulting film has a plurality of pores;
a trench formed in the interlayer insulating film;
a cover film formed over an inside surface of the trench and contacting the interlayer insulating film, the etch stop layer and the semiconductor substrate; and
a barrier layer formed over and contacting both the cover film that contacts the interlayer insulating film and the semiconductor substrate,
wherein portions of the barrier layer and the cover film provided over the bottom of the trench are removed.

2. The semiconductor device of claim 1, comprising a metal line formed over the barrier layer.

3. The semiconductor device of claim 2, wherein the metal line fills the trench.

4. The semiconductor device of claim 2, wherein the metal line is in direct contact with the semiconductor substrate.

5. The semiconductor device of claim 1, wherein the cover film comprises SiN.

6. A semiconductor device comprising:
a semiconductor substrate;
an etch stop layer formed over the semiconductor substrate;
an interlayer insulating film having a plurality of pores formed over the semiconductor substrate and contacting the etch stop layer;
a trench formed in the interlayer insulating film and the etch stop layer;
a double layer structure formed in the trench and over the sidewalls of the interlayer insulating film, the double layer structure including a cover film having a first side which contacts the interlayer insulating film and the etch stop layer and a barrier layer which contacts an opposite second side of the cover film.

7. The semiconductor device of claim 6, further comprising:
a lower conductor formed in the semiconductor substrate; and
a line filled in the trench and contacting both the lower conductor and the barrier layer.

8. A semiconductor device comprising:
a semiconductor substrate having a first metal layer formed therein;
a first silicon-based layer formed over and contacting both the semiconductor substrate and the first metal layer;
an interlayer insulating film having a plurality of pores formed over the semiconductor substrate and contacting the first silicon-based layer;
a trench formed in the interlayer insulating film and the first silicon-based layer;
a second silicon-based layer formed in the trench and contacting both the interlayer insulating film and the first silicon-based layer;
a second metal layer formed over and contacting both the second silicon-based layer and the first metal layer; and
a third metal layer filled in the trench and contacting both the first metal layer and the second metal layer.

9. The device of claim 8, wherein the first silicon-based layer comprises $SiH_4$ and the second silicon-based layer comprises SIN.

10. The device of claim 8, wherein the first metal layer comprises at least one of Cu, Al, W, Ag, Au and Pt.

11. The device of claim 8, wherein the second metal layer comprises at least one of TaN, Ta, WN, Ti, TiN, TiSiN and TaSiN.

* * * * *